United States Patent
Kijima et al.

(10) Patent No.: US 9,903,898 B2
(45) Date of Patent: Feb. 27, 2018

(54) THERMAL POLING METHOD, PIEZOELECTRIC FILM AND MANUFACTURING METHOD OF SAME, THERMAL POLING APPARATUS, AND INSPECTION METHOD OF PIEZOELECTRIC PROPERTY

(71) Applicant: YOUTEC CO., LTD., Chiba (JP)

(72) Inventors: Takeshi Kijima, Chiba (JP); Yuuji Honda, Chiba (JP); Takekazu Shigenai, Chiba (JP); Hiroyuki Ogihara, Chiba (JP)

(73) Assignee: YOUTEC CO., LTD., Chiba (JP)

( * ) Notice: Subject to any disclaimer, the term of this patent is extended or adjusted under 35 U.S.C. 154(b) by 352 days.

(21) Appl. No.: 14/578,907

(22) Filed: Dec. 22, 2014

(65) Prior Publication Data

US 2015/0188031 A1  Jul. 2, 2015

(30) Foreign Application Priority Data

Dec. 27, 2013 (JP) .................................. 2013-272682

(51) Int. Cl.
| | |
|---|---|
| *H01L 33/00* | (2010.01) |
| *G01R 29/22* | (2006.01) |
| *H05B 3/00* | (2006.01) |
| *H01L 41/257* | (2013.01) |
| *H01L 41/318* | (2013.01) |

(52) U.S. Cl.
CPC ............ *G01R 29/22* (2013.01); *H01L 41/257* (2013.01); *H01L 41/318* (2013.01); *H05B 3/0038* (2013.01)

(58) Field of Classification Search
CPC .............................. G01R 29/22; H01L 41/257
USPC ......................................................... 505/330
See application file for complete search history.

(56) References Cited

U.S. PATENT DOCUMENTS

2013/0022839 A1* 1/2013 Kijima ................. C01G 23/003
428/701

FOREIGN PATENT DOCUMENTS

| JP | 10-177194 | 6/1998 | |
|---|---|---|---|
| JP | 2013-251568 | 12/2013 | |
| WO | WO 2011/089748 | * 7/2011 | ............. C01G 33/00 |
| WO | 2012/169006 | 12/2012 | |

* cited by examiner

*Primary Examiner* — Paul Wartalowicz
(74) *Attorney, Agent, or Firm* — Wenderoth, Lind & Ponack, L.L.P.

(57) ABSTRACT

A thermal poling method in which a poling treatment can be performed easily by a dry process. The poling treatment is performed on a PZT film by performing a heat treatment on the PZT film under a pressurized oxygen atmosphere at a temperature of 400° C. or more and 900° C. or less. The PZT film before the heat treatment has a single-domain crystal structure, and the PZT film after the heat treatment has a multi-domain crystal structure.

12 Claims, 7 Drawing Sheets

SINGLE DOMAIN
d33av+ = 0.088 nm/V; d33av- = -0.091 nm/V

MULTI DOMAIN
d33av+ = -0.033 nm/V; d33av- = -0.072 nm/V

THERMAL POLING METHOD, PIEZOELECTRIC FILM AND MANUFACTURING METHOD OF SAME, THERMAL POLING APPARATUS, AND INSPECTION METHOD OF PIEZOELECTRIC PROPERTY

BACKGROUND OF THE INVENTION

1. Field of the Invention

The present invention relates to a thermal poling method, piezoelectric film and manufacturing method of same, thermal poling apparatus, and inspection method of piezoelectric property.

2. Description of the Related Art

FIG. 11 is a schematic diagram illustrating a conventional poling apparatus.

A crystal 33 is sandwiched in the center of a pair of electrodes 35 constituted of two parallel flat plates each having 10×10 mm$^2$ so that an electric field is applied in the direction not subjected to mechanical poling. In addition, the crystal 33 together with the electrodes 35 is immersed in an oil 36 of an oil bath 37, and the oil 36 in which the crystal 33 has been immersed is then heated to 125° C. by a heater 38. After having reached a specified temperature of the oil, a DC electric field of 1 kV/cm is applied between the electrodes 35 for 10 hours via lead wires 40 from a high-voltage power supply 39. Therefore, the crystal 33 is subjected to a poling treatment (for example, refer to Patent Literature 1).

[Patent Literature 1] Japanese Patent Laid-Open No. 10-177194 (Paragraph 0018, FIG. 4)

SUMMARY OF THE INVENTION

Since the above-mentioned conventional poling treatment method is a wet process in which the material to be poled is immersed in oil in a state of being sandwiched in the center of a pair of electrodes, there is a problem in which the poling treatment becomes complicated.

An aspect of the present invention is to provide any one of a thermal poling method in which a poling treatment can be performed easily by a dry process, a piezoelectric film and a manufacturing method of the same, and a thermal poling apparatus.

In addition, an aspect of the present invention is to provide an inspection method of piezoelectric property.

1. Means to Solve the Problem

Hereinafter, various aspects of the present invention will be explained.

[1] A thermal poling method, including the step of performing a poling treatment on a ferroelectric film by performing a heat treatment on the ferroelectric film under a pressurized oxygen atmosphere at a temperature of 400° C. or more and 900° C. or less.

[2] The thermal poling method according to the above [1], wherein the ferroelectric film before the heat treatment has a single-domain crystal structure, and the ferroelectric film after the heat treatment has a multi-domain crystal structure.

[3] The thermal poling method according to the above [1] or [2], wherein the pressurized atmosphere is 202650 Pa (2 atoms) or more.

[4] The thermal poling method according to any one of the above [1] to [3], wherein a time for the heat treatment is 10 sec or more (preferably 60 sec or more).

[5] The thermal poling method according to any one of the above [1] to [4], wherein the ferroelectric film is a PZT film.

[6] The thermal poling method according to any one of the above [1] to [5], wherein said ferroelectric film is a film having a perovskite or a bismuth oxide of layered structure represented by $ABO_3$ or $(Bi_2O_2)^{2+}(A_{m-1}B_m O_{3m+1})^{2-}$ where A is at least one selected from the group consisting of Li, Na, K, Rb, Pb, Ca, Sr, Ba, Bi, La and Hf, B is at least one selected from the group consisting of Ru, Fe, Ti, Zr, Nb, Ta, V, W and Mo, m is a natural number of 5 or less, a film having a superconductive oxide represented by $LanBa_2Cu_3O_7$, $Trm_2Ba_2Ca_{n-1}Cu_nO_{2n+4}$ or $TrmBa_2Ca_{n-1}Cu_nO_{2n+3}$ where Lan is at least one selected from the group consisting of Y, La, Ce, Pr, Nd, Pm, Sm, Eu, Gd, Tb, Dy, Ho, Er, Tm, Yb and Lu, Trm is at least one selected from the group consisting of Bi, Tl and Hg, n is a natural number of 5 or less, a film having a tungsten oxide of bronze structure represented by $A_{0.5}BO_3$ of square bronze structure or $A_{0.3}BO_3$ of hexagonal bronze structure where A is at least one selected from the group consisting of Li, Na, K, Rb, Cs, Pb, Ca, Sr, Ba, Bi and La, B is at least one selected from the group consisting of Ru, Fe, Ti, Zr, Nb, Ta, V, W and Mo, a film having at least one material selected from the group consisting of CaO, BaO, PbO, ZnO, MgO, $B_2O_3$, $Al_2O_3$, $Y_2O_3$, $La_2O_3$, $Cr_2O_3$, $Bi_2O_3$, $Ga_2O_3$, $ZrO_2$, $TiO_2$, $HfO_2$, $NbO_2$, $MoO_3$, $WO_3$ and $V_2O_5$, a film having a material which contains $SiO_2$ in said at least one material, or a film having a material which contains $SiO_2$ and $GeO_2$ in said at least one material.

[7] The thermal poling method according to any one of the above [1] to [5], wherein said ferroelectric film is a PZT film.

Note that, in the present description, the "PZT film" includes one containing impurities in $Pb(Zr,Ti)O_3$, and various ones may be contained as long as a function of piezoelectric property of the PZT film is not extinguished even if the impurities is contained.

[8] The thermal poling method according to any one of the above [1] to [7], wherein said ferroelectric film is formed on a substrate.

[9] The thermal poling method according to the above [8], wherein an electrode film is formed between said ferroelectric film and said substrate.

[10] A piezoelectric film, wherein a piezoelectric activity is imparted to said ferroelectric film by performing a poling treatment on said ferroelectric film by the thermal poling method according to any one of the above [1] to [9].

[11] A manufacturing method of a piezoelectric film, comprising the steps of:

forming a ferroelectric film on a substrate, and performing a poling treatment on said ferroelectric film by performing a heat treatment on said ferroelectric film under a pressurized oxygen atmosphere at a temperature of 400° C. or more and 900° C. or less, thus forming the piezoelectric film by imparting piezoelectric activity to said ferroelectric film.

[12] The manufacturing method of a piezoelectric film according to the above [11], wherein the ferroelectric film before said heat treatment has a single-domain crystal structure, and the ferroelectric film after said heat treatment has a multi-domain crystal structure.

[13] The manufacturing method of a piezoelectric film according to the above [11] or [12], wherein said pressurized atmosphere is 202650 Pa or more.

[14] The manufacturing method of a piezoelectric film according to any one of the above [11] to [13], wherein a time for said heat treatment is 10 sec or more.

[15] The manufacturing method of a piezoelectric film according to any one of the above [11] to [14], wherein said ferroelectric film formed on said substrate is formed by a sol-gel method and crystallized by heat treatment.

[16] The manufacturing method of a piezoelectric film according to any one of the above [11] to [15], wherein a substrate before forming the ferroelectric film on said substrate has an electrode film formed on said substrate.

[17] A thermal poling apparatus, comprising:
a treatment room,
a holding part arranged in said treatment room and holding a substrate having a ferroelectric film,
a gas introducing mechanism that introduces a pressurized oxygen gas into said treatment room,
a gas exhausting mechanism that exhausts the gas in said treatment room,
a lamp heater that irradiates said ferroelectric film with a lamp light, and
a control part that controls said gas introducing mechanism and said lamp heater, wherein
said control part performs a control so that said pressurized oxygen gas is introduced into said treatment room, a heat treatment is performed on said ferroelectric film under the pressurized atmosphere at a temperature of 400° C. or more and 900° C. or less by irradiating said ferroelectric film with the lamp light from said lamp heater and thus a poling treatment is performed on said ferroelectric film.

[18] An inspection method of piezoelectric property, comprising the steps of: comparing peak positions in XRD results of each of a first ferroelectric film and a second ferroelectric film, determining that a piezoelectric property is excellent when the peak position of said second ferroelectric film is shifted to a lower-angle side than the peak position of said first ferroelectric film, and determining that a piezoelectric property is not excellent when the peak position of said second ferroelectric film is not shifted to a lower-angle side than the peak position of said first ferroelectric film, wherein
said first ferroelectric film is one not subjected to a thermal poling treatment, and
said second ferroelectric film is one subjected to a thermal poling treatment.

[19] The inspection method of piezoelectric property according to the above [18], wherein
said first ferroelectric film has a single-domain crystal structure, and
said second ferroelectric film has a multi-domain crystal structure.

Note that, in above-described various aspects of the present invention, the phrase of "forming a specified B (hereinafter, referred to as "B") on (or under) a specified A (hereinafter, referred to as "A") (or "B" is formed on (or under) "A") is not limited to the case of "forming "B" (the case where "B" is formed) directly on (or under) "A"," but the phrase also includes the case of "forming "B" (the case where "B" is formed) over (or below) "A" via another substance within the scope not hindering the working effect of the present invention."

2. Effect of the Invention

According to an aspect of the present invention, it is possible to provide any of a thermal poling method in which a poling treatment can be performed easily by a dry process, piezoelectric film and manufacturing method of the same, and thermal poling apparatus.

In addition, according to another aspect of the present invention, it is possible to provide an inspection method of piezoelectric property.

DESCRIPTION OF THE PREFERRED EMBODIMENTS

Hereinafter, embodiments and examples of the present invention will be explained in detail using the drawings. However, a person skilled in the art would be able to easily understand that the present invention is not limited to the following explanation but the configuration and details thereof can be changed variously without deviating from the gist and the scope of the present invention. Accordingly, the present invention should not be construed as being limited to the description of the present embodiments and examples shown below.

<Manufacturing Method of Piezoelectric Film>

Figure 1:
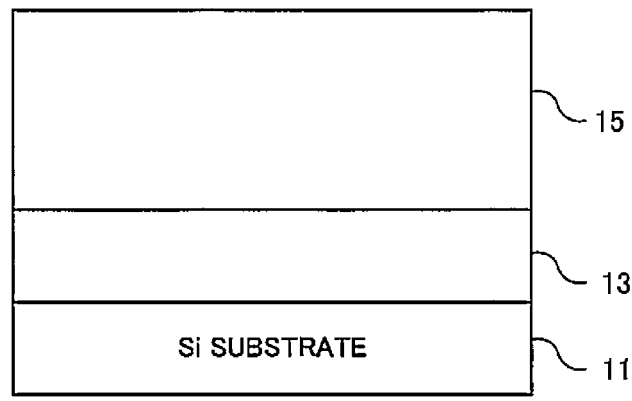
FIG. 1 is a cross-sectional view explaining a manufacturing method of a piezoelectric film according to an aspect of the present invention.

FIG. 1 is a cross-sectional view explaining a manufacturing method of a piezoelectric film according to one aspect of the present invention.

A Pt film 13 by epitaxial growth is formed on a Si substrate 11 having a crystal plane (100). The Pt film 13 is oriented to the (100) in the same way as the crystal plane (100) of the Si substrate 11. The Pt film 13 may function as an electrode film. Note that the Pt film 13 may be any electrode film other than Pt. This electrode film may be an electrode film formed of, for example, an oxide or a metal, or may be an Ir film.

A first buffer film (not shown) may be formed between the Si substrate 11 and the Pt film 13. The first buffer film may be constituted of a plural of films. In addition, the first buffer film may preferably be an oriented film of (100). The oriented film of (100) is referred to as a film oriented to the (100) in the same way as the crystal plane (100) of the Si substrate 11.

After that, a PZT film 15 is formed on the Pt film 13. This PZT film 15 preferably has a single-domain crystal structure.

Note that, in the present description, the "single domain" literally means only one domain, and means there is only one region where the same polarization component exists, so-called polarization region. All of the polarization of wafer sizes start at the same time and usually are divided into several domains, and there is a wall referred to as a domain wall between the domains. A case where there are many domains and domain walls is so-called as "multi domain". Usually, a polarization component existing along the domain wall performs polarization reversal along the wall. Namely, the single domain has a structure which is difficult to perform polarization reversal along the wall, since there is no domain wall other than at a wafer edge.

Hereinafter, a method of forming the PZT film 15 will be explained in detail.

A PZT film 15 obtained by crystallizing a PZT amorphous film is formed on a Pt film 13 by forming, on the Pt film 13, a PZT amorphous film short of lead or a PZT amorphous film having a stoichiometric composition by sol-gel process, and by performing heat treatment on the PZT amorphous film under a normal pressure oxygen atmosphere or a pressurized oxygen atmosphere. Note that a lead amount in the PZT amorphous film short of lead is preferably 80 atomic % or more and 95 atomic % or less, in contrast to the fact that the lead amount of the PZT amorphous film having a stoichiometric composition is set to be 100 atomic %.

Furthermore, a specific method of forming the PZT film 15 will be explained.

There was used, as a sol-gel solution for forming the PZT film, an E1 solution of a concentration of 10% by weight in a butanol solvent to which lead is added in an insufficient amount of 70% to 90%.

When adding an alkaline alcohol with an amino group being dimethylaminoethanol in a volume ratio of the E1 sol-gel solution:dimethylaminoethanol=7:3 to the sol-gel solution, strong alkalinity of 12 was exhibited.

A PZT amorphous film was formed by a spin coating method through the use of the above solution. MS-A200 manufactured by MIKASA Co., Ltd was used as a spin coater. First, the amorphous film was formed by rotation at 800 rpm for 5 seconds, and 1500 rpm for 10 seconds, and then by raising a rotation speed gradually to 3000 rpm in 10 seconds, and then by being allowed to stand in the atmosphere, on a hot-plate (ceramics hot-plate AHS-300 manufactured by AS ONE Co., Ltd.) of 150° C. for 5 minutes, and then, by being allowed to stand in the atmosphere, on a hot-plate (the same AHS-300) of 300° C. for 10 minutes, followed by being cooled to room temperature. The PZT amorphous film having a desired film thickness of 200 nm was formed on the Pt film 13 by repetition of this procedure five times.

Next, a PZT film 15 in which a PZT amorphous film is crystallized is formed on a Pt film 13 by performing heat treatment on the above-mentioned PZT amorphous film under a normal pressure oxygen atmosphere or a pressurized oxygen atmosphere, for example, at a temperature of 650° C. The PZT film 15 has a single-domain crystal structure.

After that, the PZT film 15 is subjected to the thermal poling treatment by performing heat treatment on the PZT film 15 at a temperature of 400° C. or more and 900° C. or less under a pressurized atmosphere. The heat treatment condition at this time is preferably at a pressure of 202650 Pa (2 atoms) or more and 1519875 Pa or less, under an oxygen atmosphere, for a treatment time of 10 seconds or more (preferably 60 seconds or more) and 60 minutes or less, for example, may be under a pressure of 10 atoms at a temperature of 550° C. for a treatment time of 30 minutes, or, for example, may be under a pressure of 10 atoms at a temperature of 850° C. for a treatment time of 1 minute to 3 minutes. In this way, a piezoelectric activity is imparted to the PZT film 15, and the crystal structure of the PZT film 15 can be made multi domain. As the result, the PZT film 15 can be made a piezoelectric film. Note that the definition of the multi domain is explained above.

In addition, a second buffer film (not shown) may be formed between the Pt film 13 and the PZT film 15. The second buffer film may be constituted of a plurality of films. Furthermore, the second buffer film may be $SrTiO_3$ film formed by, for example, spattering. The $SrTiO_3$ film 14 is formed of a composite oxide of strontium and titanium, and formed of a compound having a perovskite structure.

Moreover, although, in the present embodiment, the Si substrate 11 is used, any monocrystalline substrate other than the Si substrate 11 may be used.

In addition, although, in the present embodiment, the PZT film 15 is used, any ferroelectric film other than the PZT film may be used, and such a ferroelectric film may be formed of at least one film of the following (1) to (6).

(1) A film having a perovskite or a bismuth oxide of layered structure represented by $ABO_3$ or $(Bi_2O_2)^{2+}(A_{m-1}B_mO_{3m+1})^{2-}$ where A is at least one selected from the group consisting of Li, Na, K, Rb, Pb, Ca, Sr, Ba, Bi, La and Hf, B is at least one selected from the group consisting of Ru, Fe, Ti, Zr, Nb, Ta, V, W and Mo, m is a natural number of 5 or less (2) A film having a superconductive oxide represented by $LanBa_2Cu_3O_7$, $Trm_2Ba_2Ca_{n-1}Cu_nO_{2n+4}$ or $TrmBa_2Ca_{n-1}Cu_nO_{2n+3}$ where Lan is at least one selected from the group consisting of Y, La, Ce, Pr, Nd, Pm, Sm, Eu, Gd, Tb, Dy, Ho, Er, Tm, Yb and Lu, Trm is at least one selected from the group consisting of Bi, Tl and Hg, n is a natural number of 5 or less (3) A film having a tungsten oxide of bronze structure represented by $A_{0.5}BO_3$ of square bronze structure or $A_{0.3}BO_3$ of hexagonal bronze structure where A is at least one selected from the group consisting of Li, Na, K, Rb, Cs, Pb, Ca, Sr, Ba, Bi and La, B is at least one selected from the group consisting of Ru, Fe, Ti, Zr, Nb, Ta, V, W and Mo (4) A film having at least one material selected from the group consisting of CaO, BaO, PbO, ZnO, MgO, $B_2O_3$, Al$_2$O$_3$, Y$_2$O$_3$, La$_2$O$_3$, Cr$_2$O$_3$, Bi$_2$O$_3$, Ga$_2$O$_3$, ZrO$_2$, TiO$_2$, HfO$_2$, NbO$_2$, MoO$_3$, WO$_3$ and V$_2$O$_5$ (5) A film having a material which contains SiO$_2$ in the at least one material (6) A film having a material which contains SiO$_2$ and GeO$_2$ in the at least one material According to the present embodiment, the PZT film 15 can be subjected to the thermal poling treatment by performing heat treatment on the crystallized PZT film 15 under a pressurized atmosphere at a temperature of 550° C. or more to 900° C. or less. As the result, a piezoelectric activity is imparted to the PZT film 15 to thereby enhance the piezoelectric property. Hereinafter, details will be explained.

Since a ferroelectric film such as a PZT film 15 which is formed and crystallized by a sol-gel method has a tensile stress due to volume shrinkage at the time of forming films, the ferroelectric film is put into a state of being not movable. It is considered that the tensile stress is removed by performing the thermal poling treatment on the ferroelectric film and thus the ferroelectric film is put into a state of being easily movable. As a result, a piezoelectric activity is imparted to the ferroelectric film, and the multi-domain crystal structure can be provided.

In addition, as mentioned above, by forming the ferroelectric film such as the PZT film 15 into the multi-domain crystal structure, the piezoelectric property can be enhanced when the ferroelectric film is used as a piezoelectric element for extracting d31. The "piezoelectric element for extracting d31" in the present description is a piezoelectric element in which, when an electric field is applied in the direction perpendicular to the surface of the substrate 11, the ferroelectric film such as the PZT film 15 moves in the direction parallel to the surface of the substrate 11.

<Thermal Poling Apparatus>

Figure 2:
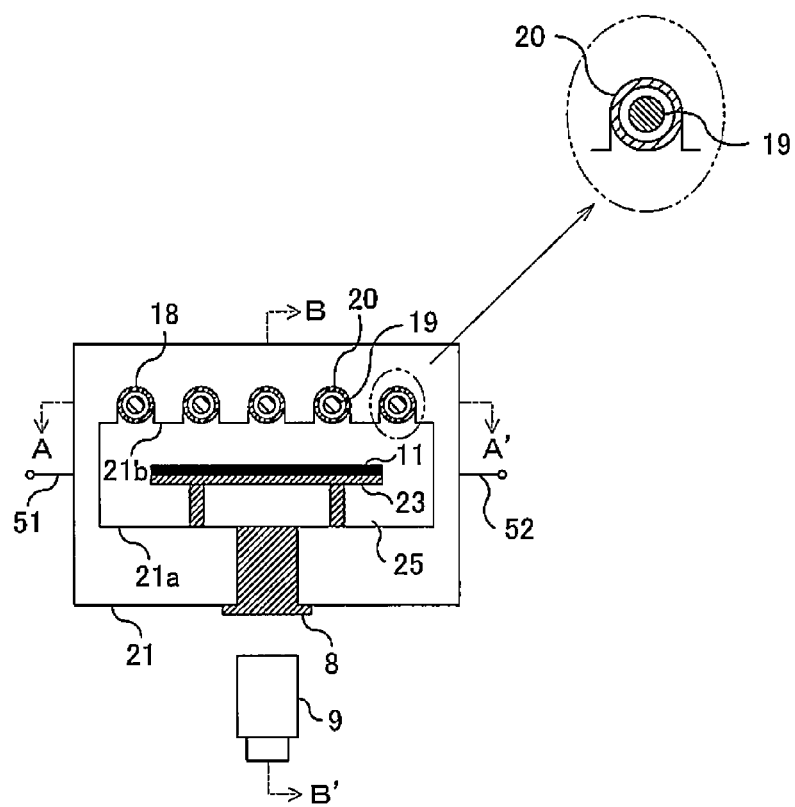
FIG. 2 is a schematic view showing a thermal poling apparatus according to an aspect of the present invention.
Figure 3:
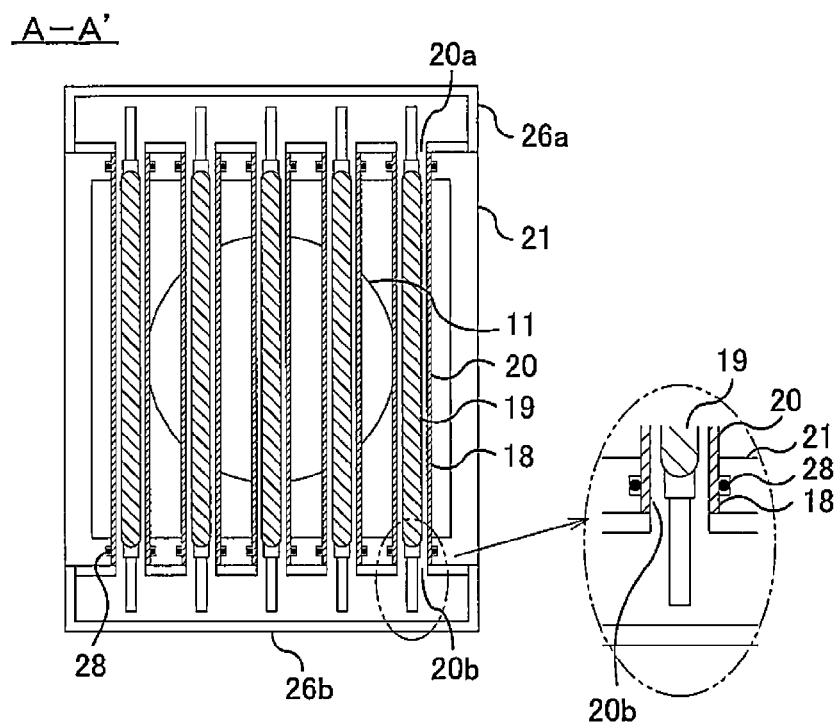
FIG. 3 is an A-A' part cross-sectional view of FIG. 2.
Figure 4:
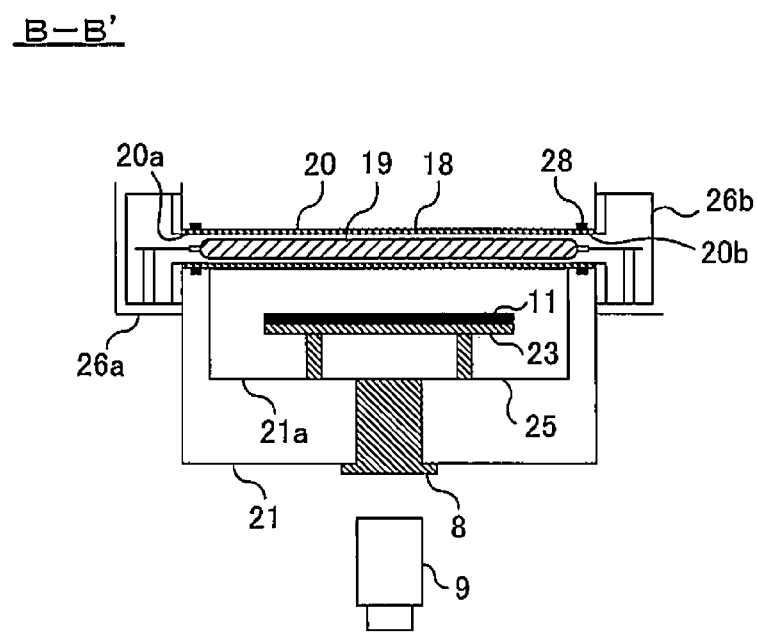
FIG. 4 is a B-B' part cross-sectional view of FIG. 2.

FIG. 2 is a schematic view of showing a thermal poling apparatus according to one aspect of the present invention. FIG. 3 is an A-A' part cross-sectional view of FIG. 2. FIG. 4 is a B-B' part cross-sectional view of FIG. 2. The above-mentioned thermal poling treatment is performed by the thermal poling apparatus. Hereinafter, details will be explained.

As shown in FIG. 2 to FIG. 4, the thermal poling apparatus has a chamber 21, and a treatment room 25 is formed by the inside of the chamber 21. The inner surface 21a of the chamber 21 is subjected to surface treatment. Namely, a reflective film is formed on the inner surface 21a of the chamber 21. This reflective film can reflect a lamp light. As a result, a temperature rising rate can be increased. In addition, the chamber 21 is constituted so as to be cooled with water by a cooling mechanism not shown.

A stage (holding part) 23 on which a Si substrate 11 having the crystallized PZT film 15 is put is provided in the chamber 21. The stage 23 is formed of a lamp light-transmissive material, for example, quartz. A plurality of transparent tubes 20 is arranged above the stage 23, and these transparent tubes 20 are formed of a lamp light-transmissive material, for example, quartz. A lamp heater 19 is arranged inside each of the plurality of transparent tubes 20.

A groove 18 is provided on the upper inner wall 21b of the chamber 21, and the inner wall of the groove 18 has a curved surface along the outer surface of the transparent tube 20. Accordingly, the transparent tube 20 can be arranged in the groove 18 in a state where the outer surface thereof is in contact with the curved surface of the inner wall of the groove 18. A wafer 22 held on the stage 23 is irradiated with the lamp light of the lamp heater 19 through the transparent tube 20.

As shown in FIG. 3 and FIG. 4, one end 20a of the transparent tube 20 is connected to the inside of a first box 26a formed of a metal, which is positioned on the outer side of the chamber 21, and the other end 20b of the transparent tube 20 is connected to the inside of a second box 26b formed of a metal, which is positioned on the outer side of the chamber 21. An exhaust duct (not shown) is connected to the first box 26a.

White O-rings 28 are arranged between the chamber 21 and each of the both ends 20a and 20b of the transparent tube 20. These O-rings 28 are used for keeping air tight in the treatment room 25.

A window is provided at the lower part of the chamber 21 which is positioned under the stage 23, and a calcium fluoride 8 is arranged in the window. A radiation thermometer 9 is arranged under the calcium fluoride 8. In order to measure a temperature of the Si substrate 11 with the radiation thermometer 9, the calcium fluoride 8 is arranged for taking in light in a wavelength region to be measured (infrared ray of 5 μm wavelength).

The treatment room 25 in the chamber 21 is connected to a pressurizing line (pressurizing mechanism) 51 having a gas introducing mechanism. The pressurizing line 51 has a pressurizing line of argon gas, a pressurizing line of oxygen gas and a pressurizing line of nitrogen gas.

Furthermore, the treatment room 25 in the chamber 21 is connected to a pressure regulating line 52 having a gas exhausting mechanism. The treatment room 25 in the chamber 21 can be pressurized to a predetermined pressure (for example, 1.014 MPa or less) by the pressure regulating line 52 and the pressurizing line 51.

In addition, the thermal poling apparatus is provided with the pressurizing line 51 having a gas introducing mechanism and a control part (not shown) controlling the lamp heater 19. The control part controls the pressurizing line 51 and lamp heater 19 so as to execute the thermal poling method described below.

<Thermal Poling Method>

The thermal poling method using the above-mentioned thermal poling apparatus will be explained.

The inside of the treatment room 25 of the chamber is set to be in a pressurized atmosphere. Specifically, for example, an oxygen gas is introduced to the treatment room 25 from an oxygen-supplying source of the pressurizing line 51. At the same time, by gradually closing a variable valve of the pressure regulating line 52, the inside of the treatment room 25 is gradually pressurized while being brought into an oxygen atmosphere. Then, the inside of the treatment room 25 is pressurized to a predetermined pressure of 1.014 MPa or less, and is maintained at that pressure. Next, heat treatment is performed on the PZT film 15 for a predetermined period of time at a temperature of 400° C. or more to 900° C. or less by irradiating the PZT film 15 on the Si substrate 11 with the lamp light from the lamp heater 19 through the transparent tube 20. According to these procedures, the PZT film 15 is subjected to the thermal poling treatment, and a piezoelectric activity is imparted to the PZT film 15.

According to the present embodiment, it is possible to perform the thermal poling treatment on the PZT film 15 in a simple manner by a dry process.

Figure 11:
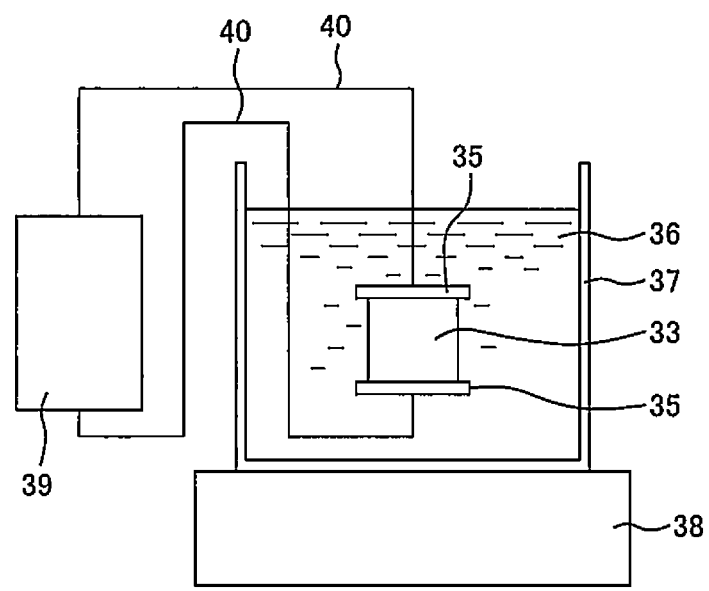
FIG. 11 is a view showing a schematic diagram illustrating a conventional poling apparatus.

Furthermore, although the conventional poling apparatus shown in FIG. 11 is a device that performs a poling treatment on a bulk material and is difficult to perform a poling treatment on a substrate formed of thin film such as a ferroelectric film, the thermal poling apparatus according to the present embodiment easily performs the poling treatment on a substrate of thin film such as a ferroelectric film.

Moreover, according to the thermal poling apparatus of the present embodiment, in performing the poling treatment on the ferroelectric film formed on the substrate, the poling treatment can be performed unless the film is divided into chip-shaped pieces.

In addition, according to the thermal poling apparatus of the present embodiment, since the poling treatment is performed by using heat, the treatment time can be shortened in comparison with that in the conventional poling apparatus, it is possible to enhance the productivity of the piezoelectric film.

Furthermore, according to the thermal poling apparatus of the present embodiment, since any oil as used in the conventional poling apparatus is not used, the deterioration of working environments of a worker due to evaporation of oil is prevented.

<Inspection Method of Piezoelectric Property>

Since the ferroelectric film before being subjected to the thermal poling treatment and the ferroelectric film after being subjected to the thermal poling treatment have different peak positions in the XRD results, it is possible to inspect the piezoelectric property of the ferroelectric film nondestructively by comparing these peak positions. Hereinafter, details will be explained.

There are prepared a first ferroelectric film which is crystallized but is not subjected to the thermal poling treatment and a second ferroelectric film which is subjected to the thermal poling treatment after crystallization. Next, peak positions in XRD results of each of the first ferroelectric film and the second ferroelectric film are compared, a piezoelectric property can be determined to be excellent when the peak position of the second ferroelectric film is shifted to a lower-angle side than the peak position of the first ferroelectric film, and a piezoelectric property can be determined not to be excellent when the peak position of the second ferroelectric film is not shifted to a lower-angle side than the peak position of the first ferroelectric film.

Note that the first ferroelectric film has a single-domain crystal structure, and the second ferroelectric film has a multi-domain crystal structure.

EXAMPLE

A naturally oxidized film is attached to a surface of a Si substrate (Si wafer) having a (100) crystal plane. A $Y_2O_3$ film, $ZrO_2$ film and a $TiO_2$ film are formed sequentially on the Si substrate, a $ZrO_2$ film, and then a Pt film is formed on the $TiO_2$ film. Hereinafter, film forming method of each film will be explained in detail.

A $ZrO_2$ film, a $Y_2O_3$ film and a $ZrO_2$ film are formed sequentially by deposition method on the Si substrate with the naturally oxidized film deposit by irradiating a $ZrO_2$ target with an electron beam for about 10 minutes, then irradiating a $Y_2O_3$ target with an electron beam for about 2 minutes, and subsequently irradiating a $ZrO_2$ target with an electron beam for about 10 minutes. The conditions at this time are as follows.

Degree of vacuum at film formation: $2 \times 10^{-4}$ Pa
Temperature of substrate: 800° C.
Rotation speed of substrate: 15 rpm
Output: 60 kW Next, a $TiO_2$ film is formed on the $ZrO_2$ film. The $TiO_2$ film is formed by forming a Ti film by DC sputtering method and then by subjecting the Ti film to heat treatment in an oxygen gas. Details are as follows.

<Film Forming Conditions of Ti Film>
Film formation device: DC spattering device
Distance between target-substrate: 50 mm
Substrate temperature: 200° C.
Gas used in film formation: Atmosphere of 100% Ar gas
Sputtering pressure: 0.5 Pa
DC power supply: 200 W
Film formation time: 20 seconds (film thickness 2 nm)

<Heat Treatment Conditions of Ti Film>
Oxygen pressure: 10 atoms
Substrate temperature: 400° C.
Treatment time: 1 min.

Then, a Pt film is formed on the $TiO_2$ film by DC spattering method. The film forming conditions at this time are as follows.

Film formation device: DC spattering device
Distance between target-substrate: 50 mm
Substrate temperature: 400° C.
Gas used in film formation: Atmosphere of 100% Ar gas
Sputtering pressure: 1 Pa
DC power supply: 400 W
Film formation time: 240 seconds (film thickness 150 nm)

Subsequently, a $SrRuO_3$ film is formed on the Pt film by spattering method. The spattering film forming conditions at this time are as follows.

Film formation pressure: 4 Pa
Substrate temperature at film formation: Normal temperature
Gas at film formation: Ar
Flow rate at film formation: 30 sccm
RF output: 300 W (13.56 MHz power supply)
Film formation time: 6 minutes (film thickness 50 nm)
Target: $SrRuO_3$ sintered material After that, the $SrRuO_3$ film is crystallized by RTA (Rapid Thermal Anneal) under a pressurized oxygen atmosphere. The RTA conditions at this time are as follows.

Annealing temperature: 600° C.
Introduced gas: oxygen gas
Pressure: 9 kg/cm$^2$
Temperature raising rate: 100° C./sec
Annealing time: 5 minutes The $SrRuO_3$ film is formed of a composite oxide of strontium and ruthenium and formed of compound having a perovskite structure.

Next, the PZT film is formed on the $SrRuO_3$ film in the following way.

There was used, as a sol-gel solution for forming the PZT film, an E1 solution obtained by adding lead in an amount of a stoichiometric composition free from shortage of lead and having a concentration of 10% by weight, in a butanol solvent.

An alkaline alcohol having an amino group, referred to as dimethylamino ethanol, was added to the sol-gel solution, at a ratio of E1 sol-gel solution:dimethylamino ethanol=7:3 in a volume ratio, which exhibited strong alkalinity of pH=12.

A PZT amorphous film was formed using the above-described solution by spin coating. MS-A200 manufactured by MIKASA CO., LTD. was used as a spin coater. First, the coater was rotated at 800 rpm for 5 seconds and at 1500 rpm for 10 seconds, and then the rotation rate was raised gradually to 3000 rpm in 10 seconds, which was allowed to stand on a hot plate (AHS-300, a ceramic hot plate manufactured by AS ONE Corporation) at 150° C. for 5 minutes in the air, and after that, was allowed to stand on a hot plate (AHS-300) at 300° C. for 10 minutes also in the air, and then was cooled to room temperature. A PZT amorphous film having an intended thickness of 773 nm was formed on the SrRuO$_3$ film by repeating the process several times. The product was formed in plural number.

Then, a PZT film obtained by crystallizing the above-described PZT amorphous film was produced on the SrRuO$_3$ film by performing a heat treatment on the above-mentioned PZT amorphous film in a pressurized oxygen atmosphere.

After that, a SrRuO$_3$ film was formed on the crystallized PZT film by the spattering method in the same way as in the above-mentioned SrRuO$_3$ film.

The sample wafer thus produced was SrRuO$_3$/PZT/SrRuO$_3$/150 nm-Pt/2 nm-TiO$_2$/15 nm-ZrO$_2$/3 nm-Y$_2$O$_3$/15 nm-ZrO$_2$/Si wafer.

Subsequently, the above-mentioned sample wafer was divided into two parts, one part of the sample wafer was not subjected to the thermal poling treatment, and the other part of the sample was subjected to the thermal poling treatment under the following three conditions.

The first condition is a treatment time of 1 minute at a temperature of 850° C., under oxygen atmosphere at 10 atoms.

The second condition is a treatment time of 2 minutes at a temperature of 850° C., under oxygen atmosphere at 10 atoms.

The third condition is a treatment time of 3 minutes at a temperature of 850° C., under oxygen atmosphere at 10 atoms.

Figure 5A:
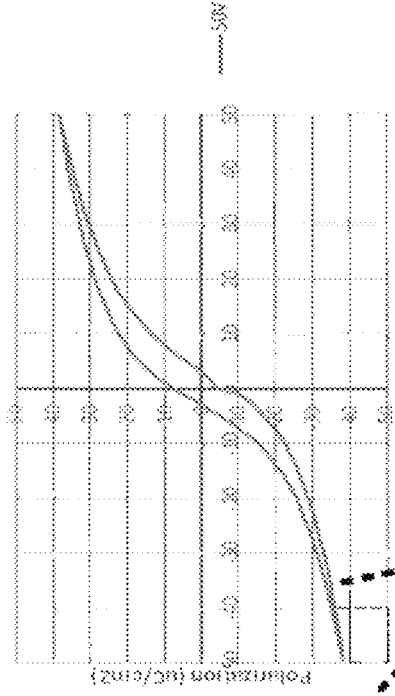
FIG. 5(A) is a view showing a hysteresis property of the PZT film of the sample wafer subjected to a thermal poling treatment under the second conditions.
Figure 5B:
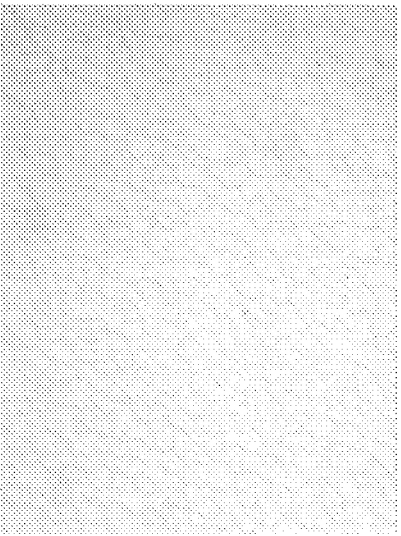
FIG. 5(B) is a photograph taken of the surface of the PZT film of the sample wafer subjected to the thermal poling treatment under the second conditions.
Figure 5C:
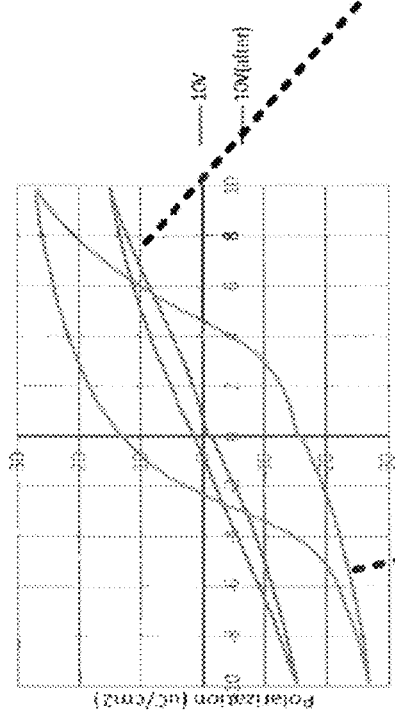
FIG. 5(C) is a view showing a hysteresis property of the PZT film of the sample wafer not subjected to the thermal poling treatment.
Figure 5D:
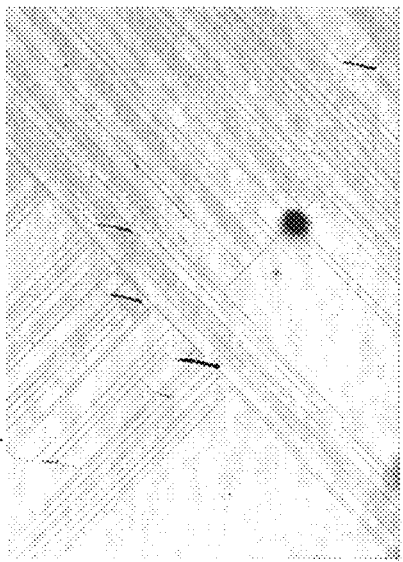
FIG. 5(D) is a photograph taken of the surface of the PZT film of the sample wafer not subjected to the thermal poling treatment.

Evaluation of the hysteresis property (refer to FIG. 5(A)) of the PZT film of the sample wafer (PA85-2-HP10) subjected to the thermal poling treatment under the above-mentioned second condition and evaluation of the hysteresis property (refer to FIG. 5(C)) of the PZT film of the sample wafer (as) not subjected to the thermal poling treatment were carried out. Note that, in FIG. 5(A) and FIG. 5(C), the vertical axis shows Polarization (μC/cm$^2$), and the horizontal axis shows Voltage (V) to be applied.

As shown in FIG. 5(C) and FIG. 5 (D), it is found that the PZT film of the sample wafer not subjected to the thermal poling treatment has a single-domain crystal structure, and has a property in which the piezoelectricity is larger than the electrostriction since the hysteresis curve is not opened enough. In contrast to this, as shown in FIG. 5(A) and FIG. 5(B), it is found that the PZT film of the sample wafer subjected to the thermal poling treatment under the second condition has a multi-domain crystal structure, and has a property in which the electrostriction is larger than the piezoelectricity since the hysteresis curve is largely opened. From these facts, it has been confirmed that the piezoelectric property can be enhanced by performing the thermal poling treatment.

Note that the hysteresis curve not opened enough shown in FIG. 5 (A) is the curve that the hysteresis curve shown in FIG. 5(C) is transcribed to FIG. 5(A). The reason why the hysteresis curve shown in FIG. 5(C) and that in FIG. 5(A) look different from each other is that the voltage in the horizontal axis is ±50 V in FIG. 5(C) and ±10 V in FIG. 5(A).

Furthermore, by turning the PZT film to a multi-domain state, it has been confirmed that a plurality of parallel-looking lines is generated on the surface of the PZT film (refer to FIG. 5(B)).

TABLE 1

| Post Anneal | | 850° C./10 atm/2 min | as |
|---|---|---|---|
| ∈r | Loc. 01 | 8.81E+03 | 7.80E+02 |
| | Loc. 02 | 8.78E+02 | 7.84E+02 |
| | Loc. 03 | 8.57E+02 | 7.87E+02 |
| | Ave. | 8.72E+02 | 7.84E+02 |
| d31(pm/V) @20 V, 1 kHz | Loc. 01 | 1.42E+02 | 5.49E+01 |
| | Loc. 02 | 1.43E+02 | 5.77E+01 |
| | Loc. 03 | 1.39E+02 | 5.72E+01 |
| | Ave. | 1.41E+02 | 5.66E+01 |

Table 1 shows the results in which there were measured the ∈$_r$ and d31, at three locations, of each of the PZT film of the sample wafer subjected to the thermal poling treatment under the second condition (Post Anneal: 850° C./10 atm/2 min.) and the PZT film of the sample wafer (as) not subjected to the thermal poling treatment. In TABLE 1, an average value (Ave.) of the three locations (Loc. 01 to 03) is also shown.

The ∈$_r$ is a dielectric constant (relative permittivity, dielectric constant), and is a ratio of a dielectric constant of a medium to a dielectric constant of vacuum ∈/∈$_0$=∈$_r$. The dielectric constant is a dimensionless amount and shows a constant value regardless a unit system to be used.

The measuring method of the ∈$_r$ is as follows.

The dielectric constant ∈$_r$=∈/∈$_0$ is obtained by assuming a dielectric constant of vacuum (condition in which no substance exists) to be ∈$_0$ (known), and assuming a dielectric constant of a certain substance to be ∈. The dielectric constant can be determined from a capacity ratio of a capacitor.

For example, the dielectric constant is measured from the change with time of charging-discharging current. However, when trying to investigate a minute change of capacity, there is a method in which a change of frequency is obtained by using a LC resonant circuit. It is possible to obtain a small change of the dielectric constant from change of electric capacity by producing two resonant circuits and obtaining a difference of those frequencies. The above measurements are performed by using a commercially available LCR meter, impedance analyzer, and the like.

The measuring method of the d31 is as follows.

A piezoelectric constant d31 means that the vibration direction is perpendicular to the polarization direction, and is a single vibration. When measuring the piezoelectric constant d31 of a thin film, the piezoelectric thin film is processed, for every substrate, into a cantilever which is a measurable form, and then is measured. For example, the Si substrate obtained by forming the piezoelectric thin film is processed into a strip form having a width of, approximately, 2 mm and a length of, approximately, 15 mm, and one end part of the strip is fixed. In applying a sinusoidal voltage to the electrode thin films formed on the upper and lower layers of the piezoelectric thin film, a displacement at the tip is measured as the displacement δ through the use of a laser Doppler vibration meter, and the d31 value is obtained by introducing the displacement value to the following equation.

$$d31 = \frac{(s_1^2 t_2^4 t + 4 s_1 s_2 t_1 t_2^3 + 6 s_1 s_2 t_1^2 t_2^2 + 4 s_1 s_2 t_1^3 t_2 + s_2^2 t_1^4)\delta}{3 s_1 s_2 t_1 (t_1 + t_2) l^2 V} \quad \text{[Equation 1]}$$

S$_1$: ELASTIC MODULUS OF SUBSTRATE
S$_2$: ELASTIC MODULUS OF PIEZOELECTRIC MATERIAL t₁: THICKNESS OF SUBSTRATE
t₂: THICKNESS OF PIEZOELECTRIC MATERIAL
l: ELECTRODE LENGTH
V. APPLIED VOLTAGE

As shown in Table 1, it was able to be confirmed that the piezoelectric activity was imparted to the PZT film by performing the thermal poling treatment on the PZT film, to thereby enhance the piezoelectric property.

Figure 6:
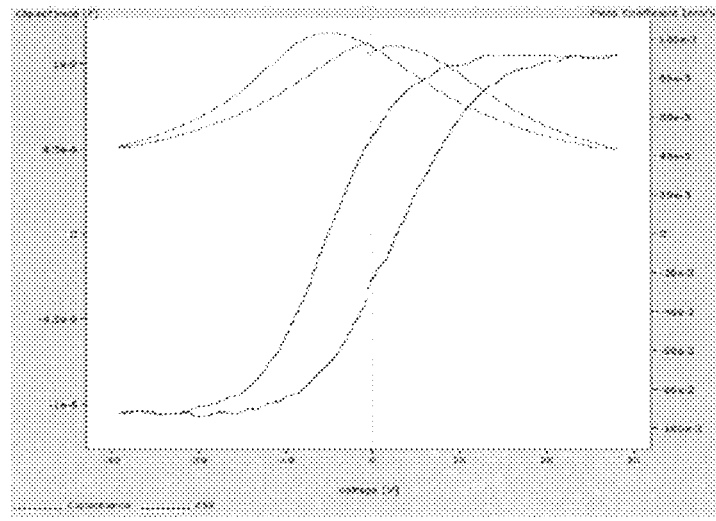
FIG. 6 is a view showing the results of the hysteresis evaluation of the PZT film of the sample wafer not subjected to the thermal poling treatment and a piezocurve of the PZT film.
Figure 7:
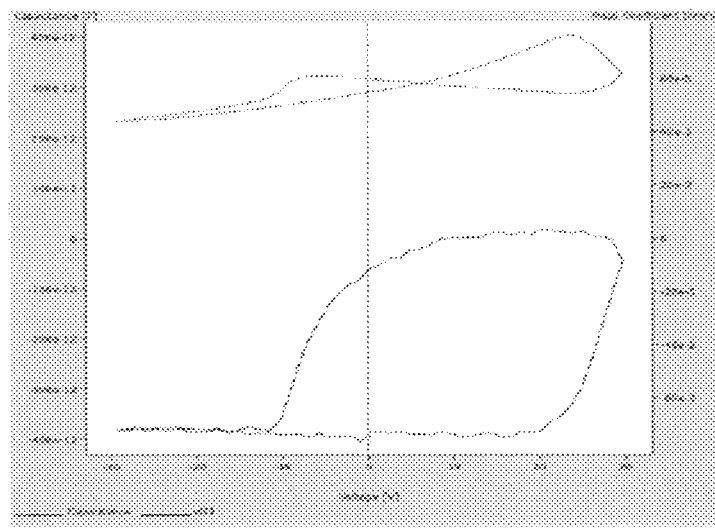
FIG. 7 is a view showing the results of the hysteresis evaluation of the PZT film of the sample wafer subjected to the thermal poling treatment under the second conditions and a piezocurve of the PZT film.

In FIG. 6 and FIG. 7, the d33 property was compared. Note that, in the present description, "d33 property" means a property of a piezoelectric element that moves the piezoelectric film in the direction perpendicular to the surface of the substrate when applying an electric field in the direction perpendicular to the surface of the substrate, in the PZT film.

FIG. 6 is a drawing which shows the result of the hysteresis evaluation of the PZT film of the sample wafer not subjected to the thermal poling treatment (vertical axis: residual polarization Pr ($\mu C/cm^2$), horizontal axis: applied voltage (V)) and the piezoelectric curve of the PZT film. FIG. 7 is a drawing which shows the result of the hysteresis evaluation of the PZT film of the sample wafer subjected to the thermal poling treatment under the second condition (vertical axis: residual polarization Pr ($\mu C/cm^2$), horizontal axis: applied voltage (V)) and the piezoelectric curve of the PZT film.

It is found that, as shown in FIG. 6, the PZT film of the single domain of the sample wafer not subjected to the thermal poling treatment drastically rises and has huge strain characteristics. In contrast to this, the PZT film of the multi domain of the sample wafer subjected to the thermal poling treatment under the second condition as shown in FIG. 7 has a flat piezoelectric property to the applied voltage.

Figure 8:
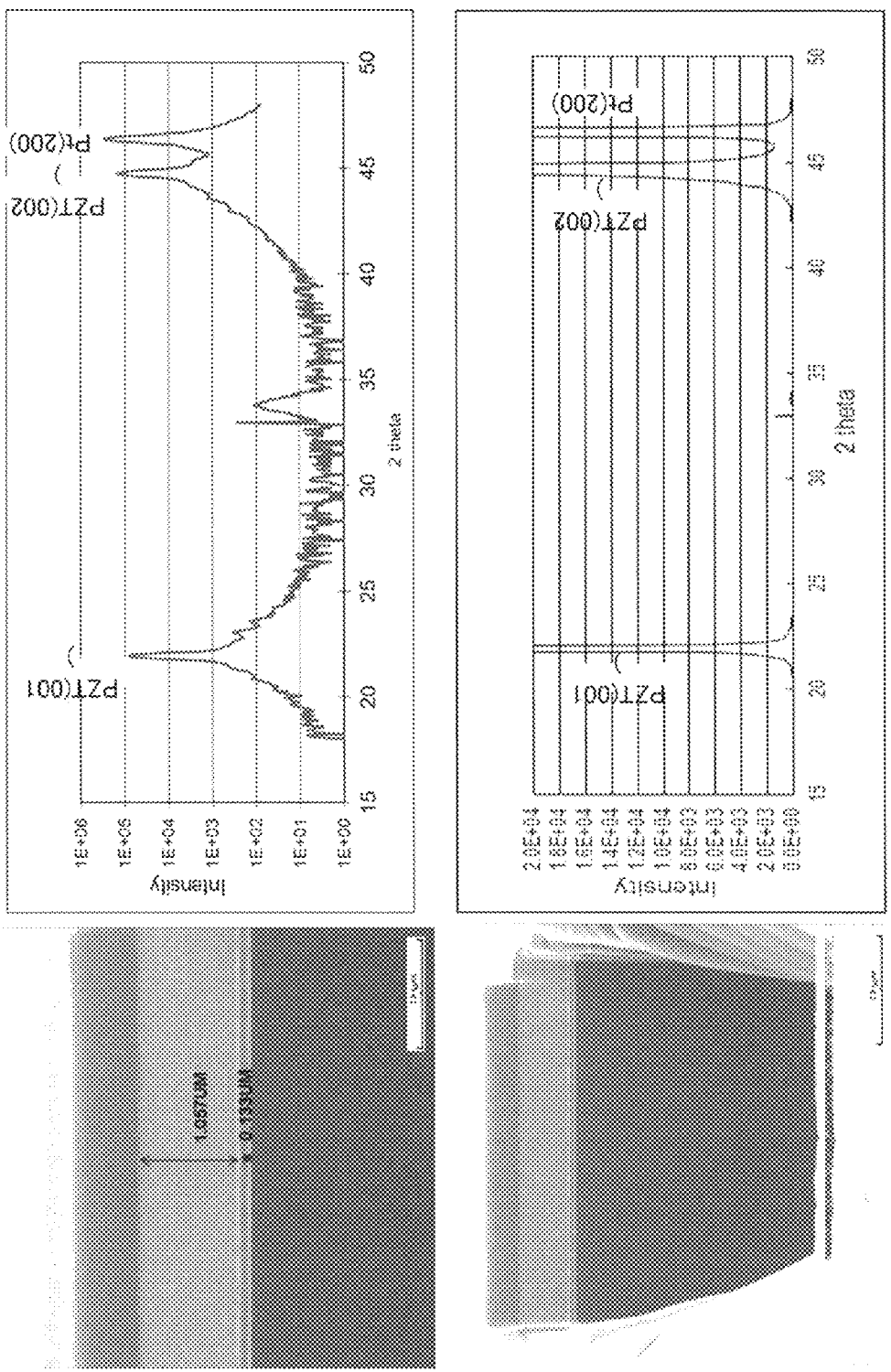
FIG. 8 is an XRD chart of the PZT film of the sample wafer subjected to the thermal poling treatment under the second conditions and an FIB cross-sectional image.

FIG. 8 is a XRD chart and a FIB cross-sectional image of the sample wafer, subjected to the thermal poling treatment under the second condition.

According to FIG. 8, although there were no differences in the XRD and FIB between the sample wafers before and after the thermal poling treatment, there was found a difference between the sample wafers before and after the thermal poling treatment in the metal microscopic photograph by observation at magnification of several tens. Namely, a single domain was observed in the sample wafer before the thermal poling treatment, whereas a multi domain was observed in the sample wafer after the thermal poling treatment (refer to FIG. 5(B) and FIG. 5(D)).

Figure 9:
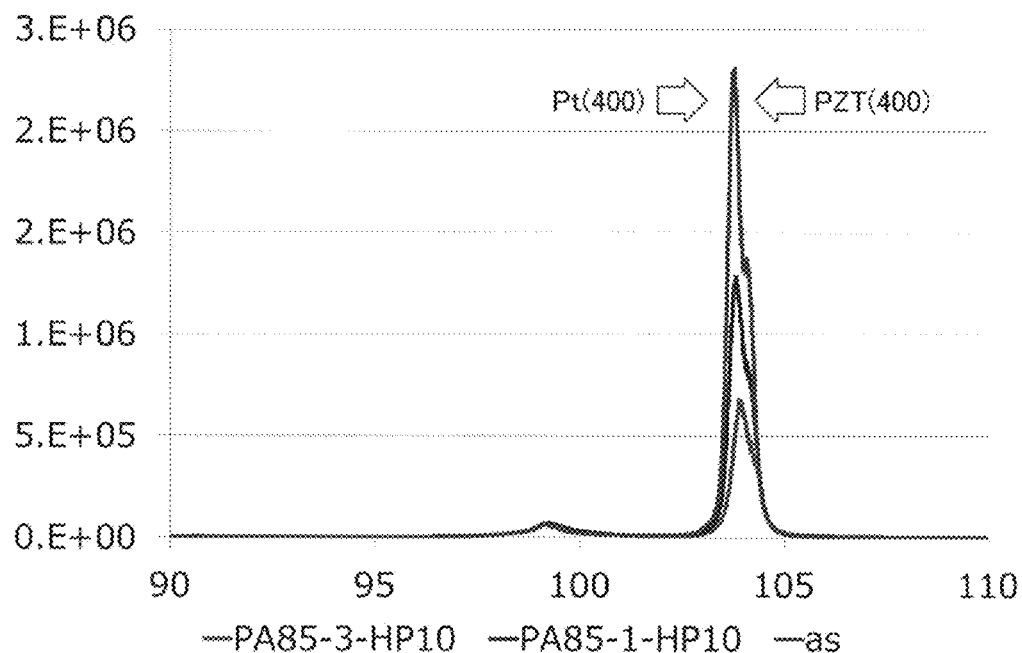
FIG. 9 is an XRD (X-Ray Diffraction) chart showing peaks of Pt (400) and PZT (400) of each of the sample wafer (as) not subjected to the thermal poling treatment, the sample wafer (PA85-1-HP10) subjected to the thermal poling treatment under the first conditions, and the sample wafer (PA85-3-HP10) subjected to the thermal poling treatment under the third conditions.
Figure 10:
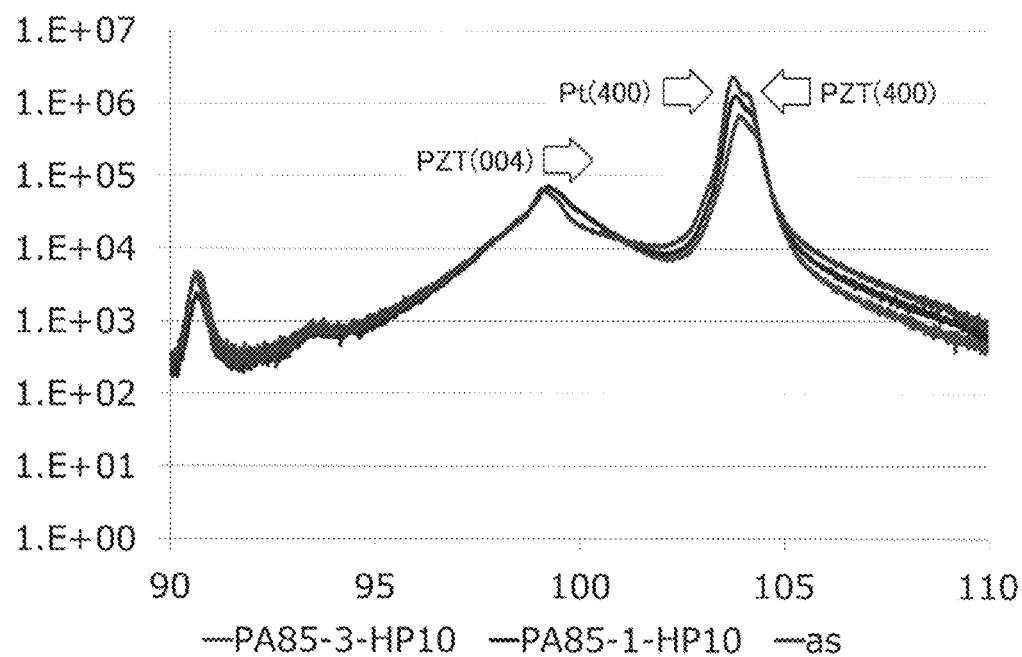
FIG. 10 is an XRD (X-Ray Diffraction) chart showing peaks of Pt (400), PZT (400) and PZT (004) of each of the sample wafer (as) not subjected to the thermal poling treatment, the sample wafer (PA85-1-HP10) subjected to the thermal poling treatment under the first conditions, and the sample wafer (PA85-3-HP10) subjected to the thermal poling treatment under the third conditions.

FIG. 9 and FIG. 10 are XRD (X-Ray Diffraction) charts in which there are shown peaks of Pt (400), PZT (400) and PZT (004) of each the sample wafer (as) not subjected to the thermal poling treatment, the sample wafer (PA85-1-HP10) subjected to the thermal poling treatment under the first condition, and the sample wafer (PA85-3-HP10) subjected to the thermal poling treatment under the third condition. In FIG. 9 and FIG. 10, the vertical axis is intensity, and the horizontal axis is 2θ.

When comparing the peak positions of the (400) PZT of each of the sample wafers shown in FIG. 9 and FIG. 10, it is found that the 2θs of the sample wafer (as), the sample wafer (PA85-1-HP10), and the sample wafer (PA85-3-HP10) are shifted to the lower-angle side in this order. In addition, the piezoelectric property is increased in order of the sample wafer (as), the sample wafer (PA85-1-HP10), and the sample wafer (PA85-3-HP10). Accordingly, it has been confirmed that the lower side the θ shift to, the higher the piezoelectric property becomes.

The above fact can be used for non-destructive inspection of a ferroelectric film such as a PZT film. Namely, when comparing the peak positions of the results of the XRD of the sample wafer (as) not subjected to the thermal poling treatment and the sample wafer subjected to the thermal poling treatment, it can be determined that the piezoelectric property becomes high if the peak position of the sample wafer subjected to the thermal poling treatment is shifted to the lower-angle side than the peak position of the sample wafer (as) not subjected to the thermal poling treatment.

In addition, when comparing the peak positions of the (400) Pt of each of the sample wafers shown in FIG. 9 and FIG. 10, it is found that the 2θs of the sample wafer (as), the sample wafer (PA85-1-HP10), and the sample wafer (PA85-3-HP10) are shifted to a higher-angle side in this order. Furthermore, when comparing the peak positions of the (004) PZT of each of the sample wafers shown in FIG. 10, it is found that the 2θs of the sample wafer (as), the sample wafer (PA85-1-HP10), and the sample wafer (PA85-3-HP10) are shifted to the higher-angle side in this order. The shifting to the higher-angle side means the decrease in the lattice constant. It is considered that the smaller lattice constant of the Pt means removing the strain of the Pt film by the thermal poling treatment to thereby restore the lattice condition of Pt itself.

DESCRIPTION OF REFERENCE SYMBOLS 8 calcium fluoride
9 radiation thermometer
11 Si substrate
13 Pt film
15 PZT film
18 groove
19 lamp heater
20 transparent tube
20a one end of transparent tube
20b other end of transparent tube
21 chamber
21a inner surface of chamber
21b upper inner wall of chamber
23 stage (holding part)
25 treatment room
26a first box
26b second box
28 White O-rings
33 crystal
35 pair of electrodes
36 oil
37 oil bath
38 heater
39 high-voltage power supply
40 lead wires
51 pressurizing line (pressurizing mechanism)
52 pressure regulating line

The invention claimed is:

1. A thermal poling method, comprising the steps of:
   forming an amorphous film on a substrate by a sol-gel method,
   forming a first crystallized ferroelectric film, having a single-domain crystal structure on said substrate by performing heat treatment on said amorphous film, and
   forming a second ferroelectric film having a multi-domain crystal structure on said substrate by performing a poling treatment on said first ferroelectric film by performing a heat treatment on said first ferroelectric film under a pressurized oxygen atmosphere at a temperature of 400° C. or more and 900° C. or less.

2. The thermal poling method according to claim 1, wherein said pressurized atmosphere is 202650 Pa or more.

3. The thermal poling method according to claim 1, wherein a time for said heat treatment of said first ferroelectric film is 10 sec or more.

4. The thermal poling method according to claim 1, wherein said second ferroelectric film is
a film having a perovskite or a bismuth oxide of layered structure represented by $ABO_3$ or $(Bi_2O_2)^{2+}(A_{m-1}B_mO_{3m+1})^{2-}$ where A is at least one selected from the group consisting of Li, Na, K, Rb, Pb, Ca, Sr, Ba, Bi, La and Hf, B is at least one selected from the group consisting of Ru, Fe, Ti, Zr, Nb, Ta, V, W and Mo, m is a natural number of 5 or less,
a film having a superconductive oxide represented by $LanBa_2Cu_3O_7$, $Trm_2Ba_2Ca_{n-1}Cu_nO_{2n+4}$ or $TrmBa_2Ca_{n-1}Cu_nO_{2n+3}$ where Lan is at least one selected from the group consisting of Y, La, Ce, Pr, Nd, Pm, Sm, Eu, Gd, Tb, Dy, Ho, Er, Tm, Yb and Lu, Trm is at least one selected from the group consisting of Bi, Tl and Hg, n is a natural number of 5 or less,
a film having a tungsten oxide of bronze structure represented by $A_{0.5}BO_3$ of square bronze structure or $A_{0.3}BO_3$ of hexagonal bronze structure where A is at least one selected from the group consisting of Li, Na, K, Rb, Cs, Pb, Ca, Sr, Ba, Bi and La, B is at least one selected from the group consisting of Ru, Fe, Ti, Zr, Nb, Ta, V, W and Mo,
a film having at least one material selected from the group consisting of CaO, BaO, PbO, ZnO, MgO, $B_2O_3$, $Al_2O_3$, $Y_2O_3$, $La_2O_3$, $Cr_2O_3$, $Bi_2O_3$, $Ga_2O_3$, $ZrO_2$, $TiO_2$, $HfO_2$, $NbO_2$, $MoO_3$, $WO_3$ and $V_2O_5$,
a film having a material which contains $SiO_2$ in said at least one material, or
a film having a material which contains $SiO_2$ and $GeO_2$ in said at least one material.

5. The thermal poling method according to claim 1, wherein said second ferroelectric film is a PZT film.

6. The thermal poling method according to claim 1, wherein an electrode film is formed between said second ferroelectric film and said substrate.

7. The thermal poling method according to claim 1, wherein when peak positions in XRD results of each of said first ferroelectric film and said second ferroelectric film are compared, a peak position of said second ferroelectric film is shifted to a lower-angle side than a peak position of said first ferroelectric film.

8. A manufacturing method of a piezoelectric film, comprising the steps of:
forming an amorphous film on a substrate by a sol-gel method,
forming a crystallized ferroelectric film, having a single-domain crystal structure on said substrate by performing heat treatment on said amorphous film, and
performing a poling treatment on said ferroelectric film by performing a heat treatment on said ferroelectric film under a pressurized oxygen atmosphere at a temperature of 400° C. or more and 900° C. or less, thus forming the piezoelectric film by imparting piezoelectric activity to said ferroelectric film,
wherein said piezoelectric film has a multi-domain crystal structure.

9. The manufacturing method of a piezoelectric film according to claim 8, wherein said pressurized atmosphere is 202650 Pa or more.

10. The manufacturing method of a piezoelectric film according to claim 8, wherein a time for said heat treatment is 10 sec or more.

11. The manufacturing method of a piezoelectric film according to claim 8, wherein a substrate before forming the ferroelectric film on said substrate has an electrode film formed on said substrate.

12. The manufacturing method of a piezoelectric film according to claim 8, wherein when peak positions in XRD results of each of said ferroelectric film and said piezoelectric film are compared, a peak position of said piezoelectric film is shifted to a lower-angle side than a peak position of said ferroelectric film.

* * * * *